United States Patent [19]

Yasumoto et al.

[11] Patent Number: 4,963,701
[45] Date of Patent: Oct. 16, 1990

[54] CIRCUIT BOARD

[75] Inventors: Takaaki Yasumoto, Kawasaki; Nobuo Iwase, Kamakura, both of Japan

[73] Assignee: Kabushiki Kaisha Toshiba, Kawasaki, Japan

[21] Appl. No.: 300,944

[22] Filed: Jan. 24, 1989

[30] Foreign Application Priority Data

| | | |
|---|---|---|
| Jan. 25, 1988 [JP] | Japan | 63-12687 |
| Aug. 23, 1988 [JP] | Japan | 63-208602 |
| Nov. 2, 1988 [JP] | Japan | 63-277931 |

[51] Int. Cl.$^5$ .............................................. H05K 1/00
[52] U.S. Cl. ................................................. 174/256
[58] Field of Search ............................... 174/68.5, 255

[56] References Cited

U.S. PATENT DOCUMENTS

| | | | |
|---|---|---|---|
| 4,470,059 | 9/1984 | Nishizawa et al. | 357/56 X |
| 4,477,311 | 10/1984 | Mimura et al. | 156/643 |
| 4,571,610 | 2/1986 | Matsushita et al. | 357/67 |
| 4,724,283 | 2/1988 | Shimada et al. | 174/68.5 |
| 4,737,757 | 4/1988 | Senda et al. | 338/314 X |
| 4,783,716 | 11/1988 | Nagase et al. | 361/230 X |

FOREIGN PATENT DOCUMENTS 62-182183  8/1987  Japan.
62-219693  9/1987  Japan.

OTHER PUBLICATIONS

Development of Highly Thermal Conductive AlN Substrate by Green Sheet Technology, IEEE 1986, Kurokawa et al.

*Primary Examiner*—Morris H. Nimmo
*Attorney, Agent, or Firm*—Oblon, Spivak, McClelland, Maier & Neustadt

[57] ABSTRACT

Disclosed is an aluminum nitride thin film circuit board having an aluminum nitride substrate and a conductive thin film pattern formed on the substrate. The conductive thin film pattern has a multi-layer structure selected from the group consisting of Ti/Ni/Au, Ti/Pd/Au, Ti/Pt/Au, Ni/Au, Cr/Au, and Cr/Cu/Au, and a boundary layer of Al-N-M-O (M is Ti, Ni, or Cr) is formed between the substrate and the conductive thin film pattern. Since the boundary layer is formed, bonding properties between the substrate and the conductive thin film pattern are improved. In particular, when the boundary layer contains 0.02 to 30 atomic % of oxygen, a higher bonding strength can be obtained.

12 Claims, 1 Drawing Sheet

CIRCUIT BOARD

BACKGROUND OF THE INVENTION

1. Field of the Invention

The present invention relates to a thin film circuit board in which a conductive film pattern is formed on the surface of an aluminum nitride substrate.

2. Description of the Related Art

Conventionally, as a substrate material of a thin film circuit board used in a semiconductor module, alumina is normally used. However, a heat amount from an operating element tends to be increased along with an improvement in performance of an active element formed on a circuit board. For this reason, a circuit board using a substrate material such as alumina having a low thermal conductivity limits the number of elements to be packed.

For this reason, a BeO thin film circuit board having a high thermal conductivity is used in place of an alumina board. However, since BeO has considerable toxicity, it poses problems during manufacture or polishing, and an application range is limited. For this reason, AlN has been widely used as a material replacing BeO. Since AlN has no toxicity, it does not poses problems in the manufacture, polishing, and disposal. In particular, since the thermal conductivity of AlN can be adjusted within a wide range of 70 to 280 W/m.K, i.e., a range 3.5 times that of alumina, and in some cases, to a level superior to that of BeO, a higher packing density than a thin film circuit board of alumina can be realized. In addition, a circuit board having both a high packing density of active elements and a desired thermal conductivity can be obtained.

As a thin film circuit board using alumina, a board in which a conductive thin film having a three layer structure of Ti/Pt/Au, Ti/Pd/Au, Cr/Pt/Au, or the like is formed on an aluminum nitride substrate is known.

However, in the circuit board with the above structure, since bonding properties between the conductive thin film and the aluminum nitride substrate are insufficient, the conductive thin film may often be peeled from the aluminum nitride substrate or disconnection of the conductive thin film may occur. Since the etching rate of the aluminum nitride substrate is varied depending on crystal orientations, a step is formed at a crystal boundary between different crystal orientations. Therefore, when the bonding properties between the conductive thin film and the aluminum nitride substrate are insufficient, disconnection of a conductive thin film pattern occurs.

The conventional thin film is patterned by etching using an etchant, e.g., aqua regia or fluoric acid having strong corrosive properties. In this case, the aluminum nitride substrate itself is also etched by such an etchant. That is, since aluminum nitride has poor anti-corrosion properties with respect to strong acids or strong alkalies as compared to aluminum or silicon, pits or trenches are formed in a substrate surface around the pattern when the conductive thin film pattern is formed. Thus, it is difficult to stably and reliably form a conductive thin film into a predetermined pattern.

SUMMARY OF THE INVENTION

It is an object of the present invention to provide an aluminum nitride thin film circuit board which has a high bonding strength of a conductive thin film pattern to an aluminum nitride substrate, and is free from peeling or disconnection of the conductive thin film pattern from the aluminum nitride substrate.

It is another object of the present invention to provide an aluminum nitride thin film circuit board having a highly reliable conductive thin film pattern with a stable pattern having an etching selectivity with respect to an aluminum nitride substrate.

According to the first aspect of the present invention, there is provided an aluminum nitride thin film circuit board comprising an aluminum nitride substrate and a conductive thin film pattern formed on the substrate, wherein the conductive thin film pattern has a multilayer structure selected from the group consisting of Ti/Ni/Au, Ti/Pd/Au, Ti/Pt/Au, Ni/Au, Cr/Au, and Cr/Cu/Au, and a boundary layer of Al-N-M-0 (M is Ti, Ni, or Cr) is formed between the substrate and the conductive thin film pattern.

The oxygen content in the boundary layer preferably falls in the range of 0.02 to 30 atomic%.

According to the first aspect of the present invention, an aluminum nitride thin film circuit board which has a high bonding strength of the conductive thin film pattern to the aluminum nitride substrate, and is free from peeling or disconnection of the conductive thin film pattern from the aluminum nitride substrate can be obtained.

According to the second aspect of the present invention, there is provided an aluminum nitride thin film circuit board comprising an aluminum nitride substrate and a conductive thin film pattern formed on the substrate, wherein the conductive thin film pattern has a multi-layer structure selected from the group consisting of Ti/Ni/Au, Ni/Au, Cr/Au, and Cr/Cu/Au.

According to the second aspect of the present invention, an aluminum nitride thin film circuit board having a highly reliable conductive thin film pattern with a stable shape having an etching selectivity with respect to an aluminum nitride substrate can be obtained.

In the first and second aspects of the present invention, the average linear surface roughness (Ra) of the aluminum nitride substrate is preferably set to be 800 nm or less. The average crystal grain size of the aluminum nitride substrate preferably falls within the range of 0.5 to 20 μm.

DETAILED DESCRIPTION OF THE PREFERRED EMBODIMENTS

Figure 1:
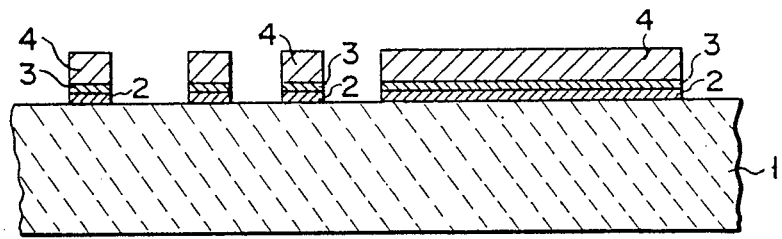
FIG. 1 is a sectional view showing a thin film circuit board according to a first embodiment of the present invention.

In a circuit board according to the first aspect of the present invention, a boundary layer is formed between a conductive thin film pattern having a multi-layer structure and an aluminum nitride substrate. The boundary layer serves to improve bonding properties between the substrate and the conductive thin film pattern. The thickness of the boundary layer preferably falls within the range of 5 to 500 nm. If the thickness is smaller than 5 nm, it is difficult to obtain a uniform bonding strength; if it exceeds 500 nm, it is difficult to perform patterning by etching.

The multi-layer structure of the conductive thin film pattern can be a two- or three-layer structure. In the case of a two-layer structure, the lower layer serves as a bonding layer, and an upper layer serves as a low-resistance layer. In the case of a three-layer structure, a lower layer serves as a bonding layer, an intermediate layer serves as a barrier layer for preventing a reaction between the lower and upper layers, and an upper layer serves as a low-resistance layer.

The thickness of the bonding layer of the conductive thin film pattern preferably falls in the range of 10 to 900 nm. If the thickness is smaller than 10 nm, it is difficult to obtain a sufficient bonding strength; if it exceeds 900 nm, the bonding layer tends to be peeled from the substrate due to its internal stress.

The thickness of the barrier layer preferably falls within the range of 50 to 1,000 nm and the thickness of the low-resistance layer preferably falls in the range of 50 to 9,000 nm.

In this invention, the average linear average surface roughness (Ra) of the AlN substrate is preferably selected to be 800 nm or less, more preferably 150 nm or less.

The average linear surface roughness (Ra) of the Al substrate is limited to a value equal to or less than 800 nm for the following reason. When the surface roughness exceeds 800 nm, disconnection of a conductor occurs or line widths become nonuniform in a patterning process of forming the conductor. In addition, bonding properties of the conductor with respect to the AlN substrate are degraded, and reliability of the thin film circuit board is impaired. The above-mentioned surface roughness can be achieved by sintering using an AlN grain raw material on the submicron order or by polishing the surface of the sintered substrate.

More specifically, the surface of the AlN substrate having predetermined dimensions may be polished by a known method, and thereafter, polishing powders having small grain sizes may be used as the surface roughness is decreased. As this AlN substrate, a sintered body prepared by adding 20 wt% or less of a sintering agent such as a rare earth element, e.g., Y, an alkali earth element, or the like to an AlN powder may be used. The N crystal grain size of the AlN substrate preferably falls within the range of 0.5 to 20 μm. If the AlN average crystal grain size is 0.5 μm or less, warp or deformation of a substrate caused by sintering may exceed an allowable range capable of forming a conductive thin film. If the grain size exceeds 20 μm, deep pits may be formed due to removal of crystal grains, and cannot be repaired by polishing.

Examples of a polishing powder include Alundum, green carbon (major component=SiC), cerium oxide, and the like. After surface roughness Ra≦300 nm is achieved by polishing using these materials, polishing may be continued using the same material as that of the AlN substrate until a desired surface roughness is attained. Before the AlN substrate is polished using a powder consisting of the major component of the substrate, pre-polishing is preferably performed using a powder having a hardness larger than that of the substrate. For example, green carbon or diamond powder is preferably used for pre-polishing. These powders can flatten a rough substrate surface to some extent, and the surface roughness can be easily reduced by the subsequent polishing. When this treatment is not performed, a group of deep pits due to removal of grains may be formed, and the above-mentioned defects cannot be easily removed by the subsequent polishing.

Then, AlN powder may be used as an abrasive in the final stage of polishing. If polishing in this stage is performed using a material having a larger hardness than that of AlN, e.g., green carbon, diamond, or the like, the number of pits due to removal of crystal grains and the number of trenches formed by polishing may be increased. When cerium oxide having a smaller hardness than that of AlN is used as the abrasive, trenches formed by polishing in the immediately preceding stage cannot be easily removed. Thus, a target surface roughness cannot be obtained. For this reason, the same material as that of the AlN substrate or a material having hardness equivalent to that of AlN is preferably used as the final abrasive. In this case, AlN used as the abrasive preferably has a grain size of 2.0 μm or less. If the grain size of the abrasive exceeds 2.0 μm, it is difficult to obtain a desired surface roughness. In order to achieve Ra≦60 nm, a grain size of 2.0 μm or less is preferable. The lower limit of the grain size is determined by the manufacturing limit of the powder. The target surface roughness is preferably selected to be Ra=60 nm and Rmax=600 nm or less. If the substrate has a surface roughness exceeding Ra=800 nm, a pattern cannot be precisely formed by etching. In addition, a nonuniform thickness of the conductive thin film due to an uneven surface causes etching anisotropy, and leads to a decrease in reliability of the conductive thin film.

Figure 2:
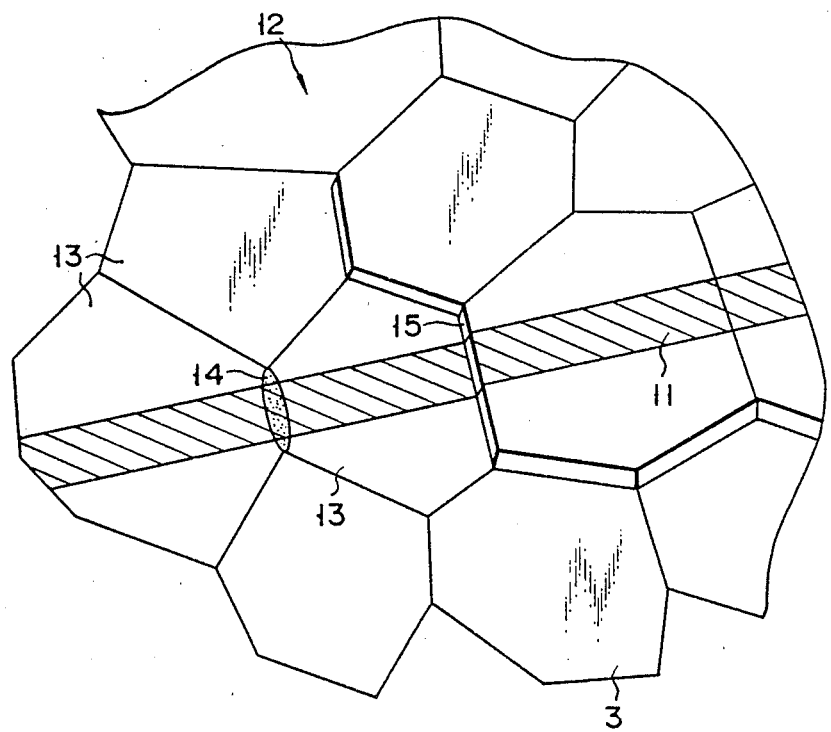
FIG. 2 is an enlarged view of a surface of an AlN substrate on which a conductive thin film pattern is formed.

According to the present invention, the surface of the AlN substrate is preferably polished to obtain a mirror surface in order to improve patterning precision of the conductor. The "mirror surface" is a macroscopic expression. In the microscopic sense, as shown in FIG. 2, heterogeneous interface 14 such as a grain boundary, grain boundary phase, and the like of crystal grains 13, and an unevenness surface caused by an impurity are formed in AlN substrate 12 on which conductor 11 is formed, and discontinuous surface (step) 15 may be formed at the polished position of each crystal grain 13. If an etchant having a large influence on the AlN substrate is used to pattern a conductive thin film like in a conventional method, the etchant promotes an etching rate difference of the crystal grains having different etching properties depending on orientation surfaces and enlarges the step of discontinuous surface 14. As a result, it is difficult to reliably form a conductor having a stable pattern.

The boundary layer preferably has an oxygen content falling within the range of 0.02 to 30 at %. If the oxygen content is selected to be less than 0.02 at %, it may be difficult to sufficiently enhance chemical reaction properties with respect to the AlN substrate and a Ti, Ni, or Cr layer as the bonding layer, and to obtain a strong bonding strength. Meanwhile, if the oxygen content exceeds 30 at %, an $Al_2O_3$ content between the AlN substrate and the Ti, Ni, or Cr layer as the bonding layer may be increased, and the conductive thin film pattern tends to be peeled from the substrate.

Note that when the circuit board employs a multilayer conductive thin film structure, a dielectric layer consisting of AlN having the same composition as that of AlN of an AlN substrate may be formed on the substrate including a first conductive thin film layer, and a second conductive thin film layer may be formed thereon through a boundary layer.

A method of manufacturing an AlN thin film circuit board according to the first aspect of the present invention will be briefly described below.

An AlN substrate having a desired thermal conductivity and an appropriate surface roughness suitable for forming a boundary layer and a conductive thin film layer is prepared. The surface roughness can be controlled by polishing a sintered AlN substrate or using a sintered AlN substrate manufactured using submicron grains as a raw material.

A TiN, NiN, or CrN layer is formed on the substrate by a conventional film formation method such as vacuum deposition method, a sputter deposition method, or the like, thereby forming a AlN(Ti, Ni, Cr)O boundary layer. In this case, a substrate temperature, atmosphere, degree of vacuum, and film formation rate are adjusted as needed. Prior to formation of the TiN, NiN, or CrN layer, the substrate surface is sufficiently washed by a wet washing method, a reverse-sputtering method, or the like. Since the AlN substrate is unstable in strong acids or strong alkalies, a washing solution must be carefully selected, and a neutral washing solution is preferably used. The oxygen content in the boundary layer is controlled according to a film formation atmosphere, purity of a film formation material, and the like. A Ti, Ni, or Cr layer is formed without changing a vacuum pressure. An Ni/Au, Pd/Au, Pt/Au, Au, or CuAu layer is subsequently formed still in the vacuum state. Thereafter, these layers are patterned by a photo-etching technique using a resist, thereby forming boundary layer 2, bonding layer 3, and low-resistance layer (including a barrier layer) 4 on AlN substrate 1, as shown in FIG. 1. These layers are then patterned to manufacture an AlN thin film circuit board. Etching of the conductive thin pattern is performed using an etchant of $KI+I_2+$ deionized water for an Au layer, an etchant of $CuSO_4+HCl+$ethyl alcohol+deionized water for an Ni layer, an etchant of HF+deionized water for Ti and TiN layers, and an etchant of $H_2SO_4+$deionized water for Cr and CrN layers.

According to the first aspect of the present invention, since the boundary layer is formed between the conductive thin film pattern and the substrate, the conductive thin film pattern can be formed on the substrate with an extremely high bonding strength. More specifically, when a thin film layer is normally formed on an AlN substrate with a high bonding strength, the bonding strength depends on the lattice constants of the thin film layer and the substrate, a difference in linear expansion coefficient, and a chemical reactivity therebetween. Paying attention to the lattice constant, TiN, NiN, or CrN of the boundary layer directly contacting the AlN substrate has an NaCl type cubic structure. Taking the closest packed surface in a [111] direction into consideration, however, TiN, NiN, or CrN has a hexagonal structure, and its lattice constant is approximate to that of AlN. In this case, a rate of misfitting with the lattice constant of AlN is low, and the TiN, NiN, or CrN layer can be strongly bonded to the AlN substrate. The Ti, Ni, or Cr layer as the bonding layer has sufficient chemical reactivity with respect to the TiN, NiN, or CrN layer as the boundary layer, and provides good bonding properties with respect to the conductive layer formed thereon. Therefore, when a conductive layer is formed on the boundary layer and the bonding layer, the bonding strength of the conductive thin film pattern with respect to the AlN substrate can be improved.

Furthermore, when the boundary layer (TiN, NiN, or CrN layer) directly contacting the AlN substrate contains 0.02 to 30 at % of oxygen, the bonding strength of the boundary layer with respect to the AlN substrate can be remarkably improved.

According to the present invention, since the conductive thin film pattern can be provided on the AlN substrate with a high bonding strength, an AlN thin film circuit board which can prevent peeling or disconnection of the conductive thin film pattern in use and can realize a high packing density of active elements can be obtained.

According to the second aspect of the present invention, a conductive thin film pattern having a multi-layer structure selected from the group consisting of Ti/Ni/Au, Ni/Au, Cr/Au, and Cr/Cu/Au is formed on an aluminum nitride substrate. The arrangement and manufacturing method of the second aspect are the same as those in the first aspect except that no boundary layer is formed, and the material of the conductive thin film pattern is limited as compared to the first aspect.

According to the second aspect of the present invention, since the conductive thin film pattern is formed of the above-mentioned materials, an etchant having low corrosion properties with respect to an aluminum nitride substrate can be employed upon patterning. For this reason, a highly reliable conductive thin film pattern with a stable shape can be formed.

The present invention will be described in detail below by way of its examples.

EXAMPLES 1–5

First, an AlN substrate having a thermal conductivity of 280 W/m.K was lapped and polished so as to have an average linear surface roughness of 800 nm, and the substrate surface was then subjected to wet washing and sputter Ar Ion etching. Subsequently, a boundary layer and a conductive thin film layer were formed on the surface of the AlN substrate under the conditions shown in Table 1 below. A resist pattern was formed on the conductive thin film layer by a photoetching technique, and then, using the pattern as a mask, an Au layer was etched using an etchant of $KI+I_2+$deionized water; using an Ni layer, an etchant of $CuSO_4+HCl+$ethyl alcohol+deionized water; a Cu layer, using an etchant of $HNO_3+$deionized water; a Pt layer, using an etchant of aqua regia+deionized water; a Ti layer and a TiN layer, using an etchant of HF+deionized water; and a Cr layer and a CrN layer, using an etchant of $H_2SO_4+$deionized water. Thus, a conductive thin film pattern was formed through the boundary layer, thereby manufacturing an AlN thin film circuit board.

For thin film circuit boards of Examples 1 to 5, the bonding strength of the conductive thin film pattern was tested by the tensile test, and the presence/absence of disconnection of the conductive thin film pattern after a 1,000-hour temperature cycle test (held at −50° C. and 150° C. each for 30 minutes) was examined. Table 1 also summarizes the test results.

As can be apparent from Table 1, in the thin film circuit boards of Examples 1 to 5, the bonding strength of the conductive thin film pattern with respect to the AlN substrate was sufficient, i.e., 2 kg/mm$^2$ or more, and no disconnection was observed after the 1,000-hour temperature cycle test, thus revealing their reliability.

TABLE 1

| | Substrate Temperature upon Deposition (°C.) | Forming Means of Boundary are Conductive Thin Film Layers | Type and Thickness of Boundary Layer (nm) | Oxygen Content in Boundary Layer Contacting Substrate (at %) | Type and Thickness of Conductive Thin Film Layer (nm) | Bonding Strength of Conductive Thin film Layer by Tensile Test (MPa) | State After 1,000-hour Temperature Cycle Test |
|---|---|---|---|---|---|---|---|
| Example 1 | 200 | Sputter Deposition Method | TiN/Ti 5/10 | 30 | Ni/Au 300/200 | 42 | No Disconnection |
| Example 2 | 200 | Sputter Deposition Method | TiN/Ti 500/90 | 1 | Ni/Au 300/200 | 41 | No Disconnection |
| Example 3 | 200 | Sputter Deposition Method | CrN/Cr 20/80 | 0.1 | Cu/Au 400/300 | 42 | No Disconnection |
| Example 4 | 40 | Sputter Deposition Method | TiN/Ti 10/50 | 0.02 | Ni/Au 400/300 | 41 | No Disconnection |
| Example 5 | 200 | Vacuum Deposition Method | TiN/Ti 30/60 | 5 | Pt/Au 300/200 | 40 | No Disconnection |

EXAMPLE 6

First, an AlN substrate having a thermal conductivity of 280 W/m·K was lapped and polished so as to have an average linear surface roughness of 150 nm. The surface of the AlN substrate was plasma-etched using an Ar gas containing 0.5 vol% of oxygen at a power of 300 W to supply oxygen to the surface of the AlN substrate. Thereafter, Ti, Ni, and Au layers were formed by an RF sputtering in an atmosphere of Ar under the conditions shown in Table 2. A 7μm wide resist pattern was formed on the uppermost Au layer by photoetching. Using a pattern as a mask, the Au layer was etched by an etchant of KI+I$_2$+deionized water; the Ni layer, an etchant of CuSO$_4$+HCl+ethyl alcohol+deionized water; and the Ti layer, an etchant of HF+deionized water, thus forming a conductor having a three-layer structure. In the manner, an AlN thin film circuit board was manufactured.

EXAMPLE 7

Ti, Ni, and Au layers were formed on the surface of an AlN substrate which was subjected to lapping and polishing treatments and a plasma treatment using an Ar gas containing oxygen following the same procedures as in Example 6, under the conditions shown in Table 2. These layers were patterned following the same procedures as in Example 6, thus manufacturing an AlN thin film circuit board having a conductor of a three-layer structure.

For the thin film circuit boards in Examples 6 and 7, the bonding strength of the conductive film pattern with respect to the AlN substrate and the presence/absence of disconnection were examined. Table 2 also shows the test results.

As can be understood from Table 2, the thin film circuit boards of Examples 6 and 7 had remarkably high bonding strengths with respect to the AlN substrates, and no disconnection was observed. Thus, these circuit boards had extremely high reliability.

TABLE 2

| | Temperature of AlN Substrate (°C.) | Constituting Layer and Thickness (nm) of Conductor | Oxygen Content (at %) in AlN Substrate and Surface of Ti Layer | Bonding Strength (MPa) | Disconnection |
|---|---|---|---|---|---|
| Example 6 | 200 | Ti: 30 Ni: 300 Au: 500 | 5 | 25 | Not Found |
| Example 7 | 350 | Ti: 45 Ni: 300 Au: 600 | 1 | 22 | Not Found |

EXAMPLES 8–10

AlN substrates having crystal grain sizes shown in Table 3 were polished respectively using abrasives of #1,200 alundum, #2,500 alundum, and #4,000 green carbon. Thereafter, these substrates were subjected to final polishing using an AlN powder having an average grain size of 0.6 μm under the conditions shown in Table 3. Note that an AlN material used for each substrate was a sample having a thermal conductivity of 70 to 280 W/m·K.

EXAMPLES 11–13

AlN substrates having crystal grain sizes shown in Table 3 were polished respectively using abrasives of #1,200 alundum, #2,500 alundum, #4,000 green carbon, and #6,000 green carbon. Thereafter, these substrates were subjected to final polishing using an AlN powder having an average grain size of 2.0 μm under the conditions shown in Table 3. Note that an AlN material used for each substrate was a sample having the same thermal conductivity as that in Examples 8 to 10.

An Au (250 nm/Ni (60 nm) layer was formed on each substrate in Examples 8 to 13 as a conductive thin film, and was patterned by sputtering and photolithography to form 7-μm wide wirings and 1-mm square pads. Thereafter, the resistance of the wiring and a peel strength of the pad were measured. In order to evaluate reliability, a 1,000-hour pressure cooker test was conducted. Table 3 also summarizes the test results.

In these Examples, AlN thin film circuit boards having a surface roughness of Ra=60 nm and Rmax=600 nm or less could be obtained. The resistance of the conductive thin film pattern and the peel strength of the pad were respectively about 100 Ω and 23.0 mPa. No peeling of the conductive thin film was observed after the 1,000-hour pressure cooker test.

TABLE 3

Characteristics of Thin Film Circuit Board

| Example | Crystal Grain Size (μm) | Resistance (Ω) | Reliability | Disconnection | Peeling Strength (MPa) | Surface Roughness Ra/Rmax (nm) |
| --- | --- | --- | --- | --- | --- | --- |
| 8 | 0.5 | 105 | 1000 h | Not Found | 25 | 10/90 |
| 9 | 1.4 | 97 | 1000 h | Not Found | 23 | 15/102 |
| 10 | 5.0 | 100 | 1000 h | Not Found | 20 | 20/200 |
| 11 | 10.0 | 102 | 1000 h | Not Found | 23 | 31/280 |
| 12 | 15.0 | 100 | 1000 h | Not Found | 23 | 40/310 |
| 13 | 20.0 | 101 | 1000 h | Not Found | 23 | 60/600 |

Note that reliability 1,000h represents that no defects such as peeling were found in the conductive thin film.

EXAMPLES 14 and 15

An AlN substrate having a thermal conductivity of 280 W/m·K was lapped and polished so as to have a surface roughness of 150 nm or less. Thereafter, an Au/Ni layer was formed as a conductive layer on the substrate by methods and under conditions shown in Table 4 below. A resist pattern of a 7-μm wide conductive wiring pattern was formed using a positive type resist. Using the pattern as a mask, the Au layer was etched by an etchant of $KI+I_2$+deionized water, and the Ni layer was etched by an etchant of $CuSO_4$+HCl+ethyl alcohol+deionized water.

EXAMPLES 16 and 17

An AlN substrate having a thermal conductivity of 280 W/m·K was lapped and polished so as to have a surface roughness of 150 nm or less. Thereafter, an Au/Cr layer was formed as a conductive layer on the substrate by methods and under conditions shown in Table 4. A conductive wiring pattern was then formed following the same procedures as in Examples 14 and 15. Note that Cr was etched by an etchant of $H_2SO_4$+deionized water.

The conductive wiring patterns in Examples 14 to 17 have bonding strengths exceeding 20 Mpa with respect to the substrate, and no disconnection was observed, as shown in Table 4 below. Thus, these patterns were uniform and practical patterns.

TABLE 4

| Example | Substrate Temperature (°C.) | Au Film Thickness (nm) | Bonding Layer Thickness (nm) | Bonding Strength (MPa) | Disconnection |
| --- | --- | --- | --- | --- | --- |
| 14 | 200 | 500 | 30 | 25 | Not Found |
| 15 | 35 | 600 | 45 | 22 | Not Found |

TABLE 4-continued

| Example | Substrate Temperature (°C.) | Au Film Thickness (nm) | Bonding Layer Thickness (nm) | Bonding Strength (MPa) | Disconnection |
| --- | --- | --- | --- | --- | --- |
| 16 | 200 | 590 | 200 | 23 | Not Found |
| 17 | 100 | 980 | 100 | 26 | Not Found |

EXAMPLES 18–21

Examples suitable for a thin film capacitor module will be explained below.

A thin film capacitor having a desired area and constituted by a lower conductive thin film layer, a dielectric thin film layer, an upper conductive thin film layer, and a wiring conductive layer are formed on an AlN substrate having a surface roughness (Ra) of 150 nm or less and a thermal conductivity of 70 W/m·K or more. When the thin film capacitor structure is an interdigitated structure, the lower conductive thin film layer is omitted. If the surface roughness (Ra) exceeds 150 nm, reliability of the thin film capacitor module is degraded since disconnection of the conductive layer and nonuniformity of a wiring width are caused. The surface roughness is controlled by polishing a sintered substrate or using a sintered substrate using a submicron grain raw material. As a thin film formation method, a conventional thin film formation method such as a deposition method, sputtering method, or the like is used, and a substrate temperature, atmosphere, degree of vacuum, power density, and boat current are adjusted as needed. When ferroelectrics are sputtered, a substrate temperature preferably falls within the range of 500° to 800° C. if annealing is not required after film formation, and a substrate temperature preferably falls within the range of a room temperature to 300° C. for other materials. For an atmosphere, when a target is an oxide, an argon-oxygen gas mixture containing 50% or more of Ar is preferable since less thin film composition errors occur. A power density is preferably selected to be 2.0 W/cm² or less in order to keep stoichiometry. An example of a conductive material includes a metal and an oxide conductor. For example, Pt, Au, Ti, Ni, Cr, and the like or their alloys, and an oxide conductor represented by $Ba_2YCu_3O_{7-y}$ are preferably used. In particular, an oxide conductor compound is a preferable material since it can prevent peeling of a conductive film due to oxidation by annealing or mechanical mismatching with respect to a dielectric thin film of the oxide. The AlN substrate has no toxicity and less limitations in the manufacture, fabrication, and disposal as compared to BeO. In particular, when the AlN substrate has a thermal conductivity of 250 W/m·K or more, it has better heat radiation characteristics than those of BeO, and a higher packing density of active elements can be achieved. The dielectric thin film can be oxide ferroelectric compounds, i.e., perovskite compounds such as $(PbCa)\{Mg_{1/3}Nb_{2/3})(Zn_{1/3}Nb_{2/3})Ti\}O_3$, $(PbBa)\{Mg_{1/3}Nb_{2/3})(An_{1/3}Nb_{2/3})Ti\}O_3$, $SrTiO_3$, and the like, thus posing no problem. These compounds can be used as a sole dielectric thin film or a multi-layer structure dielectric thin film in accordance with characteristics such as an operating temperature, dielectric constant, dielectric tangent, and the like of an objective thin film capacitor.

Examples 18–21 will be explained more concretely below.

Two AlN substrate having a thermal conductivity 260 W/m·K were lapped and polished to have a surface roughness of 150 nm or less. Thereafter, a 1.0-$\mu$m thick $Ba_2YCu_3O_{7-y}$ film was formed as a lower conductive layer by an RF sputtering method at a gas pressure of 5 Pa, an argon to oxygen ratio of 1:1, a power density of 2 W/cm$^2$, and a substrate temperature of 30° C. A 1.5-$\mu$m thick dielectric layer having a $(PbCa)\{(Mg_{1/3}Nb_{2/3})(Zn_{1/3}Nb_{2/3})Ti\}O_3$ composition was formed on the lower conductive layer by the RF sputtering method under the same conditions as that of the lower conductive layer. Finally, a Pt upper conductive layer was formed following the same procedures as that for the lower conductive layer. At the same time, a resistor of ruthenium oxide was formed. These layers were patterned using a mask. One resultant thin film capacitor (Example 18) was annealed under the conditions shown in Table 5 below. The other capacitor (Example 19) was not annealed. Two thin film capacitor modules having capacitances of 80 nF/cm$^2$ or more could be obtained. Furthermore, when commercially available active elements were mounted and operated, an increase in substrate temperature was within 10° C. as shown in FIG. 5.

Two AlN substrate having a thermal conductivity of 260 W/m·K were lapped and polished to have a surface roughness of 150 nm or less. Thereafter, a Ti/Pt layer having a thickness of 0.1/1.0 $\mu$m was formed as a lower conductive layer by an RF sputtering method at a gas pressure of 0.5 Pa, a ratio of argon to oxygen of 1:1, a power density of 4 W/cm$^2$, and a substrate temperature of 30° C. Finally, a Pt layer was formed as an upper conductive layer following the same procedures as those of the lower conductive layer. These layers were patterned using a mask. One resultant thin film capacitor (Example 20) was annealed under the conditions shown in Table 5. The other capacitor (Example 21) was not annealed. Thus, two thin film capacitor modules having capacitances of 80 nF/cm$^2$ or more could be obtained. Furthermore, when commercially available active elements were mounted and operated, an increase in substrate temperature was within 10° C. as shown in Table 5.

As described above, in order to prevent a decrease in packing density of a thin film wiring packing module, a thin film capacitor module in which a thin film capacitor having a high dielectric constant is formed on an AlN substrate having a high thermal conductivity can be obtained.

TABLE 5

| Example | Annealing Temperature (°C.) | Capacitance (nF) | Dielectric Tangent (%) | Substrate Temperature (Room Temperature 25° C.) |
|---|---|---|---|---|
| 18 | 600 | 85 | 1.5 | 34 |
| 19 | Not Performed | 80 | 1.3 | 31 |
| 20 | 900 | 90 | 1.9 | 30 |
| 21 | Not Performed | 80 | 1.1 | 33 |

What is claimed is:

1. An aluminum nitride thin film circuit board comprising an aluminum nitride substrate and a conductive thin film pattern formed on said substrate, wherein said conductive thin film pattern has a multi-layer structure selected from the group consisting of Ti/Ni/Au, Ti/Pd/Au, Ti/Pt/Au, Ni/Au, Cr/Au, and Cr/Cu/Au, and a boundary layer of Al-N-M-O (M is Ti, Ni, or Cr) is formed between said substrate and said conductive thin film pattern.

2. A circuit board according to claim 1, wherein said boundary layer contains 0.02 to 30 atomic % of oxygen.

3. A circuit board according to claim 1, wherein said boundary layer has a thickness of 5 to 500 nm.

4. A circuit board according to claim 1, wherein said aluminum nitride substrate has an average linear surface roughness of not more than 800 nm.

5. A circuit board according to claim 1, wherein said aluminum nitride substrate comprises aluminum nitride crystals having an average particle size of 0.5 to 20 $\mu$m.

6. A circuit board according to claim 1, wherein said conductive thin film pattern comprises a bonding layer having a thickness of 10 to 900 nm, a barrier layer having a thickness of 50 to 1,000 nm, and a low-resistance layer having a thickness of 50 to 9,000 nm.

7. A circuit board according to claim 1, wherein said conductive thin film pattern comprises a bonding layer having a thickness of 10 to 900 nm and a low-resistance layer having a thickness of 50 to 9,000 nm.

8. An aluminum nitride thin film circuit board comprising an aluminum nitride substrate and a conductive thin film pattern formed on said substrate, wherein said conductive thin film pattern comprises a multi-layer structure selected from the group consisting of Ti/Ni/Au, Ni/Au, Cr/Au, and Cr/Cu/Au.

9. A circuit board according to claim 8, wherein said aluminum nitride substrate has an average linear surface roughness of not more than 800 nm.

10. A circuit board according to claim 8, wherein said aluminum nitride substrate comprises aluminum nitride crystals having an average particle size of 0.5 to 20 $\mu$m.

11. A circuit board according to claim 8, wherein said conductive thin film pattern comprises a bonding layer having a thickness of 10 to 900 nm, a barrier layer having a thickness of 50 to 1,000 nm, and a low-resistance layer having a thickness of 50 to 9,000 nm.

12. A circuit board according to claim 8, wherein said conductive thin film pattern comprises a bonding layer having a thickness of 10 to 900 nm and a low-resistance layer having a thickness of 50 to 9,000 nm.

* * * * *